US010431701B2

(12) United States Patent
Sun et al.

(10) Patent No.: US 10,431,701 B2
(45) Date of Patent: Oct. 1, 2019

(54) SEMICONDUCTOR DEVICE, ARRAY SUBSTRATE AND METHOD FOR FABRICATING SEMICONDUCTOR DEVICE

(71) Applicant: BOE TECHNOLOGY GROUP CO., LTD., Beijing (CN)

(72) Inventors: Jianming Sun, Beijing (CN); Rui Huang, Beijing (CN); Huili Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/767,605

(22) PCT Filed: Sep. 22, 2017

(86) PCT No.: PCT/CN2017/102862
§ 371 (c)(1),
(2) Date: Apr. 11, 2018

(87) PCT Pub. No.: WO2018/166166
PCT Pub. Date: Sep. 20, 2018

(65) Prior Publication Data
US 2019/0044007 A1    Feb. 7, 2019

(30) Foreign Application Priority Data
Mar. 13, 2017   (CN) .......................... 2017 1 0146018

(51) Int. Cl.
*H01L 31/02* (2006.01)
*H01L 31/0224* (2006.01)
(Continued)

(52) U.S. Cl.
CPC .... *H01L 31/022483* (2013.01); *G06K 9/0004* (2013.01); *H01L 27/1443* (2013.01);
(Continued)

(58) Field of Classification Search
CPC ........... H01L 31/022483; H01L 29/786; H01L 31/1884; H01L 31/1016; H01L 31/105; G06K 9/0004
See application file for complete search history.

(56) References Cited

U.S. PATENT DOCUMENTS 10,038,022 B1 *   7/2018   Chen ................... H01L 27/1462
2002/0079493 A1 *   6/2002   Morishita ............. G01T 1/2018
257/72
(Continued)

FOREIGN PATENT DOCUMENTS

CN    102456623 A    5/2012
CN    105243361 A    1/2016
(Continued)

OTHER PUBLICATIONS

International Search Report from corresponding PCT Application No. PCT/CN2017/102862 dated Dec. 25, 2017 (5 pages).
(Continued)

Primary Examiner — Charles D Garber
Assistant Examiner — S M Sohel Imtiaz
(74) Attorney, Agent, or Firm — Harness, Dickey & Pierce, P.L.C.

(57) ABSTRACT

The present disclosure relates to a semiconductor device, an array substrate, and a method for fabricating the semiconductor device. The semiconductor device comprises a substrate, a thin film transistor formed on the substrate, and a first light detection structure adjacent to the thin film transistor, wherein the first light detection structure includes a first bottom electrode, a top electrode, and a first photosensing portion disposed between the first bottom electrode and the first top electrode, one of a source electrode and a drain electrode of the thin film transistor is disposed in the same layer as the first bottom electrode of the first light detection structure; the other of the source electrode and the
(Continued)

drain electrode of the thin film transistor is used as the first top electrode.

20 Claims, 9 Drawing Sheets

(51) Int. Cl.
*G06K 9/00* (2006.01)
*H01L 31/105* (2006.01)
*H01L 31/101* (2006.01)
*H01L 31/18* (2006.01)
*H01L 29/786* (2006.01)
*H01L 27/144* (2006.01)

(52) U.S. Cl.
CPC ........ *H01L 27/1446* (2013.01); *H01L 29/786* (2013.01); *H01L 31/105* (2013.01); *H01L 31/1016* (2013.01); *H01L 31/1884* (2013.01)

(56) References Cited

U.S. PATENT DOCUMENTS

| | | | | |
|---|---|---|---|---|
| 2003/0183019 A1* | 10/2003 | Chae | ............... | G06K 9/0004 73/862.624 |
| 2005/0224698 A1* | 10/2005 | Uehara | ............ | H01L 27/14679 250/214 R |
| 2008/0297709 A1* | 12/2008 | Eguchi | ............... | G02F 1/13338 349/139 |
| 2009/0009675 A1* | 1/2009 | Cho | ................... | H01L 31/0352 349/43 |
| 2009/0066866 A1* | 3/2009 | Takama | ............. | G02F 1/13338 349/33 |
| 2012/0104405 A1* | 5/2012 | Choi | ................... | H01L 27/124 257/72 |
| 2015/0179869 A1* | 6/2015 | Xie | ................... | H01L 27/14603 257/53 |
| 2015/0277171 A1* | 10/2015 | Hwang | .............. | G02F 1/13306 349/46 |
| 2015/0340511 A1* | 11/2015 | Yan | ................... | H01L 29/66969 257/43 |
| 2016/0013242 A1* | 1/2016 | Yang | ................... | H01L 27/1214 257/292 |
| 2016/0380019 A1* | 12/2016 | Yang | ................... | H01L 27/1214 438/59 |
| 2017/0032167 A1* | 2/2017 | Chen | ................... | H01L 27/3227 |
| 2017/0074722 A1* | 3/2017 | Zhang | .................... | G01J 1/429 |
| 2017/0092673 A1* | 3/2017 | Miyamoto | ........ | H01L 27/14614 |
| 2018/0301495 A1* | 10/2018 | Ito | ..................... | H01L 27/14636 |

FOREIGN PATENT DOCUMENTS

| | | |
|---|---|---|
| CN | 106129069 A | 11/2016 |
| CN | 106935601 A | 7/2017 |

OTHER PUBLICATIONS

Written Opinion from corresponding PCT Application No. PCT/CN2017/102862 dated Dec. 25, 2017 (4 pages).

* cited by examiner

SEMICONDUCTOR DEVICE, ARRAY SUBSTRATE AND METHOD FOR FABRICATING SEMICONDUCTOR DEVICE

CROSS-REFERENCE TO RELATED APPLICATION

This application claims the benefit of China Patent Application No. 201710146018.6 filed on Mar. 13, 2017, the entire contents of which are hereby incorporated by reference as part of this application.

FIELD

The present disclosure relates to the field of semiconductor technology, more particularly, to a semiconductor device, an array substrate, and a method for fabricating the semiconductor device.

BACKGROUND

Optical detection technology is used in the display area including semiconductor devices. For example, an external light source can affect the visual effect of the screen, so adjusting the brightness of the screen's light source based on the brightness of the external light source can improve the visual effect of the screen.

Optical detectors can be used for fingerprint identification. Fingerprint identification using optical detectors has a higher requirement on optical detection devices demanding a larger light detection area to detect higher photocurrent. In particular, integrating the fingerprint identification technology in the TFT-LCD display would have a higher requirement on detection of light.

BRIEF SUMMARY

Embodiments of the present disclosure provide a method for fabricating a semiconductor device, an array substrate, and a semiconductor device and may at least solve the problem of light detection that can not be efficiently integrated with the thin film transistor in the related art and may at least increase the light-sensing area of the device without affect the aperture ratio.

A first aspect of the present disclosure provides a semiconductor device. The semiconductor device includes a substrate; a thin film transistor formed on the substrate; and a first light detection structure adjacent to the thin film transistor, wherein the first light detection structure comprises a first bottom electrode, a first top electrode, and a first photosensitive portion disposed between the first bottom electrode and the first top electrode, one of a source electrode and a drain electrode of the thin film transistor is disposed in the same layer as the first bottom electrode of the first light detection structure; the other of the source electrode and the drain electrode of the thin film transistor is used as the first top electrode.

In one embodiment, the first photosensitive portion has a bottom surface, a top surface, a first side surface facing the thin film transistor, and a second side surface facing away from the thin film transistor, the semiconductor device further including: a first spacing layer between the thin film transistor and the first light detection structure, wherein the first spacing layer covers the first side surface and spaces the one of the source electrode and the drain electrode apart from the first bottom electrode.

In one embodiment, the semiconductor device further includes a second light detection structure adjacent to the second side surface of the first light detection structure, wherein, the second light detection structure includes a second bottom electrode, a second top electrode, and a second photosensitive portion disposed between the second bottom electrode and the second top electrode, wherein, the second bottom electrode and the first bottom electrode are as a whole; the second photosensitive portion extends on the second side surface.

In one embodiment, the semiconductor device further includes a second spacing layer disposed between the first light detection structure and the second light detection structure, wherein the second spacing layer covers the second side surface and spaces the first top electrode apart from the second photosensitive portion.

In one embodiment, the semiconductor device further includes an insulating layer, wherein the insulating layer has a first portion, a second portion, and a third portion, the first portion being provided between a active layer and a gate electrode of the thin film transistor, the second portion overlying the first top electrode, and the third portion overlying the second photosensitive portion.

In one embodiment, the first photosensitive portion includes a visible light sensitive material, and the first top electrode includes a transparent conductive material.

In one embodiment, the first photosensitive portion includes a PIN photosensitive structure.

In one embodiment, the second photosensitive portion includes a UV light-sensitive material, and the second top electrode includes a transparent conductive material.

In one embodiment, the active layer of the thin film transistor and the second photosensitive portion of the second light detection structure comprise indium gallium zinc oxide.

Another object of the present disclosure is to provide an array substrate.

A second aspect of the present disclosure provides an array substrate. The array substrate includes the semiconductor device described as above.

It is still another object of the present disclosure to provide a method for fabricating a semiconductor device.

A third aspect of the present disclosure provides a method for fabricating a semiconductor device. The method for fabricating the semiconductor device includes forming a thin film transistor on a substrate and a first light detection structure adjacent to the thin film transistor, wherein the first light detection structure comprises a first bottom electrode, a top electrode and a first photosensitive portion disposed between the first bottom electrode and the first top electrode, one of a source electrode and a drain electrode of the thin film transistor is disposed in the same layer as the first bottom electrode of the first light detection structure; the other of the source electrode and the drain electrode of the thin film transistor is used as the first top electrode.

In one embodiment, the method further includes: forming a second light detection structure adjacent to a second side surface of the first light detection structure, wherein the second light detection structure comprises a second bottom electrode, a second top electrode, and a second photosensitive portion disposed between the second bottom electrode and the second top electrode, wherein, the second bottom electrode and the first bottom electrode are as a whole; the second photosensitive portion extends on the second side surface.

In one embodiment, the thin film transistor and the second light detection structure are formed simultaneously.

In one embodiment, forming the thin film transistor, the first light detection structure and the second light detection structure includes: forming, on a substrate, a first sub-conductive layer as one of a source electrode and a drain electrode of the thin film transistor and a second sub-conductive layer as a first bottom electrode of the first light detection structure, wherein, a space is arranged between the first sub-conductive layer and the second sub-conductive layer; forming the first photosensitive portion on the second sub-conductive layer; forming a second conductive layer on the first photosensitive portion serving as the first top electrode; forming a first spacing layer and a second spacing layer on the first photosensitive portion, wherein the first spacing layer covers a first side surface of the first photosensitive portion and the space, and the second spacing layer covers a second side surface of the first photosensitive portion and a portion of the first top electrode; forming a first semiconductor layer and a second semiconductor layer on the first spacing layer and the second spacing layer, wherein the first semiconductor layer overlies the first spacing layer and is in contact with the first top electrode to serve as an active layer of the thin film transistor and the second semiconductor layer overlies the second spacing layer to serve as the second photosensitive portion of the second light detection structure; forming a second capping layer on the first semiconductor layer and the second semiconductor layer; forming a third conductive layer on the second capping layer to form a gate electrode of the thin film transistor; forming a fourth conductive layer on the second capping layer, wherein the fourth conductive layer is in contact with the second semiconductor layer to serve as the second top electrode.

In one embodiment, forming the first sub-conductive layer and the second sub-conductive layer on the substrate includes: forming a first conductive layer on the substrate; patterning the first conductive layer to form the first sub-conductive layer and the second sub-conductive layer separated by the space, forming the first spacing layer and forming the second spacing layer comprises: disposing a first capping layer on the space, the first side surface, a top surface of the first top electrode and the second side surface; patterning the first capping layer such that the patterned first capping layer comprises a first opening on the top surface of the first top electrode to form the first spacing layer and the second spacing layer spaced apart by the first opening, forming the first semiconductor layer and the second semiconductor layer comprises: forming a layer of semiconductor material on the first spacing layer and the second spacing layer; patterning the layer of semiconductor material such that the patterned layer of semiconductor material comprises a second opening on the top surface of the first top electrode to form the first semiconductor layer and the second semiconductor layer spaced apart by the second opening, and wherein the second opening is smaller than the first opening and the first semiconductor layer is in contact with the first top electrode It is still another object of the present disclosure to provide a display panel.

A fourth aspect of the present disclosure provides a display panel. The display panel includes the array substrate as described above.

Still another object of the present disclosure is to provide a display device.

A fifth aspect of the present disclosure provides a display device. The display device includes the display panel as described above.

BRIEF DESCRIPTION OF THE DRAWINGS

To describe the technical solutions in the embodiments of the present disclosure more clearly, the accompanying drawings of the embodiments are briefly described below. It should be understood that the drawings described below refer only to some embodiments of the present disclosure, and not to restrict the present disclosure, wherein.

DETAILED DESCRIPTION

Figure 1:
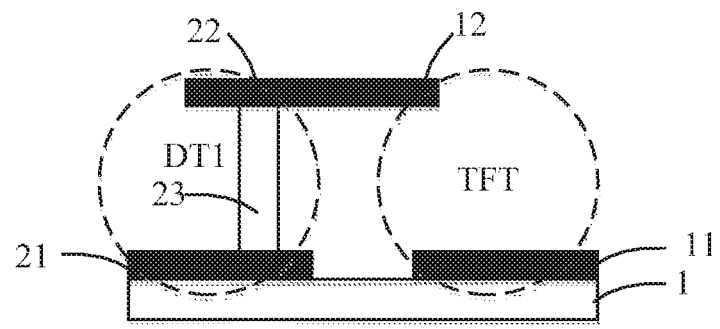
FIG. 1 is a schematic diagram of a semiconductor device according to an embodiment of the present disclosure.

In order to make the objectives, technical solutions and advantages of the embodiments of the present disclosure more comprehensible, the technical solutions of the embodiments of the present disclosure are clearly and completely described below with reference to the accompanying drawings. Obviously, the described embodiments are only a part but not all of the embodiments of the present disclosure. Based on the described embodiments of the present disclosure, all other embodiments obtained by those skilled in the art without creative efforts shall also fall within the protection scope of the present disclosure.

As used herein and in the appended claims, the singular form of a word includes the plural, and vice versa, unless the context clearly dictates otherwise. Thus, the references "a", "an", and "the" are generally inclusive of the plurals of the respective terms. Similarly, the words "comprise", "comprises", and "comprising" are to be interpreted inclusively rather than exclusively.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

FIG. 1 is a schematic view of a semiconductor device according to an embodiment of the present disclosure. As shown in FIG. 1, a semiconductor device according to an embodiment of the present disclosure may include a substrate 1, a thin film transistor TFT formed on the substrate, and a first light detection structure DT1 adjacent to the thin film transistor. The first light detection structure DT1 includes a first bottom electrode 21, a first top electrode 22, and a first photosensitive portion 23 disposed between the first bottom electrode and the first top electrode, one (11) of a source electrode and a drain electrode of the thin film transistor is disposed in the same layer as the first bottom electrode 21 of the first light detection structure; the other (12) of the source electrode and the drain electrode of the thin film transistor is used as the first top electrode.

Through a thin film transistor formed on the substrate and a first light detection structure adjacent to the thin film transistor, wherein the first light detection structure includes a first bottom electrode, a first top electrode and a first photosensitive portion between the first bottom electrode and the first top electrode, one of a source electrode and a drain electrode of the thin film transistor being in the same layer as the first bottom electrode of the first light detection structure; the other of the source electrode and the drain electrode of the thin film transistor is used as the first top electrode, the thin film transistor and the light detection structure may at least be integrated in one device, and may at least achieve light detection without additional equipment, fabricating costs are reduced, and the aperture ratio is increased.

Figure 2:
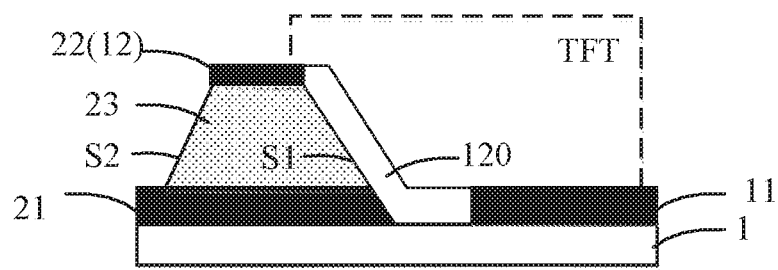
FIG. 2 is a schematic view of a semiconductor device according to an embodiment of the present disclosure.

FIG. 2 is a schematic view of a semiconductor device according to an embodiment of the present disclosure. For the sake of simplicity, some portions of the thin film transistor TFT are omitted in FIG. 2. As shown in FIG. 2, the first photosensitive portion 23 has a bottom surface, a top surface, a first side surface S1 facing the thin film transistor, and a second side surface S2 facing away from the thin film transistor. The semiconductor device further comprises: a first spacing layer 120 between the first light detection structure DT1, wherein the first spacing layer 120 covers the first side surface S1 and separates one 11 of the source electrode and drain electrode from the first bottom electrode 21.

Figure 3:
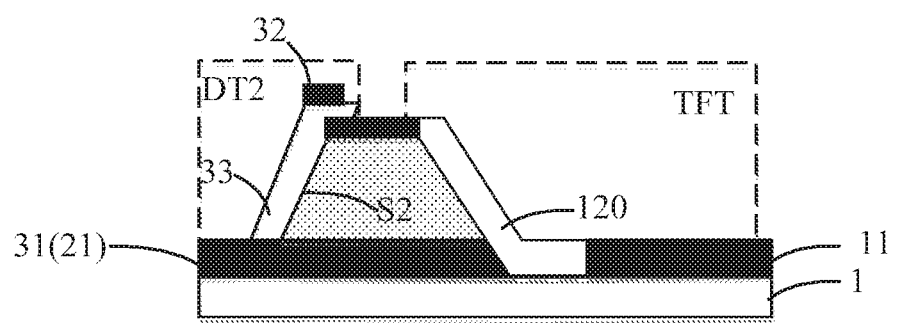
FIG. 3 is a schematic diagram of a semiconductor device according to an embodiment of the present disclosure.

FIG. 3 is a schematic view of a semiconductor device according to an embodiment of the present disclosure. As shown in FIG. 3, the semiconductor device further includes a second light detection structure DT2 adjacent to the second side surface S2 of the first light detection structure, where the second light detection structure DT2 includes a second bottom electrode 31, a second top electrode 32 and a second photosensitive portion 33 disposed between the second bottom electrode 31 and the second top electrode 32, wherein the second bottom electrode 31 is integral with the first bottom electrode 21; the second photosensitive portion 33 extends on the second side surface S2.

Figure 4:
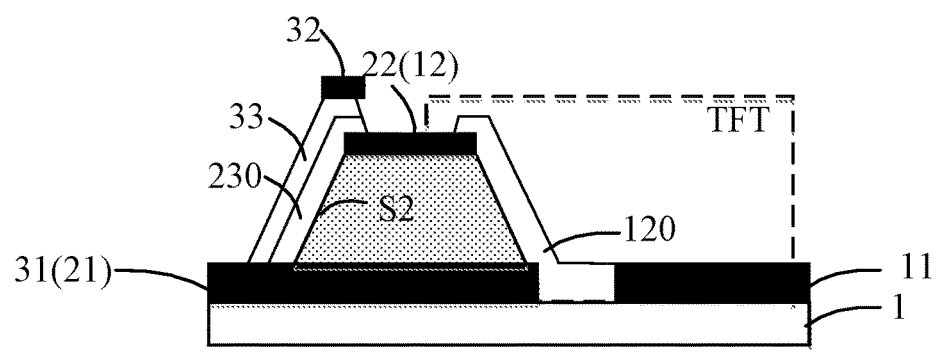
FIG. 4 is a schematic view of a semiconductor device according to an embodiment of the present disclosure.

FIG. 4 is a schematic diagram of a semiconductor device according to an embodiment of the present disclosure. As shown in FIG. 4, the semiconductor device further includes a second spacing layer 230 disposed between the first light detecting structure DT1 and the second light detecting structure DT2, wherein the second spacing layer 230 covers the second side surface S2 and spaces the first top electrode 22 apart from the second photosensitive portion 33.

Figure 5:
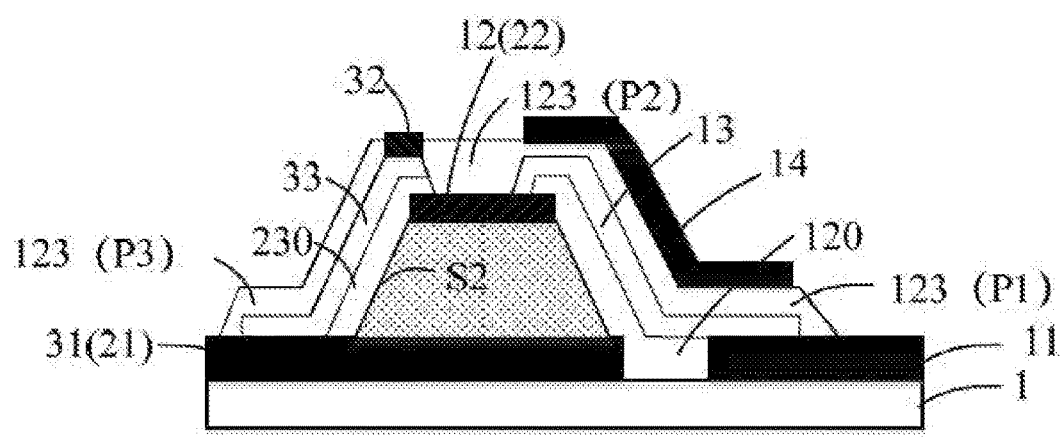
FIG. 5 is a schematic view of a semiconductor device according to an embodiment of the present disclosure.

FIG. 5 is a schematic view of a semiconductor device according to an embodiment of the present disclosure. As shown in FIG. 5, the semiconductor device further includes an insulating layer 123, wherein the insulating layer has a first portion P1, a second portion P2, and a third portion P3 disposed between the active layer 13 of the thin film transistor and the gate electrode 14, the second portion overlies the first top electrode 22, and the third portion covers the second photosensitive portion 33. It can be seen that the thin film transistor shown in FIG. 5 has a longer length in the longitudinal direction (ie, the direction perpendicular to the upper surface of the substrate). Thus, when the semiconductor device of FIG. 5 is used for the display device, it is possible to improve the aperture ratio of the display device.

In an embodiment, the first light detection structure may be a visible light detection structure. In this case, the first photosensitive portion may include a visible light sensitive material, and the first top electrode may include a transparent conductive material. For example, the first photosensitive portion may include a PIN photosensitive structure. Light detection structures, such as PIN photosensitive structures, can detect the optical power incident on their surface. The transparent conductive material may include indium tin oxide (ITO). When a finger touches a device provided with the semiconductor device of an embodiment of the present disclosure, the optical path of the light is changed due to the refraction of the finger causing the resistance of the first photosensitive portion changes. The change of the resistance of the first photosensitive portion causes the current output by the first light detection structure to change, therefore the fingerprint identification can be performed.

In an embodiment, the second photosensitive portion may include a UV-sensitive material, and the second top electrode may include a transparent conductive material such as ITO. When the second photosensitive portion receives different intensities of ultraviolet light, the conductivity of the ultraviolet-sensitive material serving as the photosensitive portion changes. The corresponding intensity of ultraviolet light can be obtained based on the output current of the second light detection structure at this time.

One of the source electrode and the drain electrode of the thin film transistor, which is provided in the same layer as the first bottom electrode, as well as the first bottom electrode may be formed of a layer or layers including one or more of: molybdenum (Mo), molybdenum niobium alloy (MoNb), aluminum (Al), aluminum neodymium alloy (AlNd), titanium (Ti) and copper (Cu). The first spacing layer, the second spacing layer and the insulating layer may include a layer or layers including one or more of silicon oxide (SiOx), silicon nitride (SiNx), hafnium oxide (HfOx), silicon oxynitride (SiON).

Considering the driving function of the thin film transistor and the light sensing function of the photo detector, the material of the active layer of the thin film transistor and the second photosensitive portion of the second light detection structure may include indium gallium zinc oxide (IGZO).

The semiconductor device according to an embodiment of the present disclosure enables the thin film transistor and the light detection structure to be integrated in one device, enables light detection without an additional device, reduces fabricating cost, and increases aperture ratio. Visible light detection structure can be used for fingerprint identification and external light source intensity detection. A UV detection structure can detect the intensity of ultraviolet light, and thus meets the needs of detecting the intensity of UV light, without the need for additional devices, and avoids the risk of the product damage caused by additional devices.

Embodiments of the present disclosure also provide an array substrate. The array substrate includes the semiconductor device described above.

Embodiments of the present disclosure also provide a method for fabricating a semiconductor device. In one embodiment, a method for fabricating a semiconductor device may include forming a thin film transistor on a substrate and a first light detection structure adjacent to the thin film transistor, wherein the first light detection structure includes a first bottom electrode, a top electrode and a first photosensitive portion disposed between the first bottom electrode and the first top electrode, one of a source electrode and a drain electrode of the thin film transistor is disposed in the same layer as the first bottom electrode of the first light detection structure; the other of the source electrode and the drain electrode of the thin film transistor is used as the first top electrode.

In one embodiment, a method for fabricating a semiconductor device further includes forming a second light detection structure adjacent to a second side surface of the first light detection structure, wherein the second light detection structure comprises a second bottom electrode, a second top electrode, and a second photosensitive portion disposed between the second bottom electrode and the second top electrode, wherein, the second bottom electrode and the first bottom electrode are integral; the second photosensitive portion extends on the second side surface.

In an embodiment, the thin film transistor and the second light detection structure may be formed simultaneously.

Figure 6:
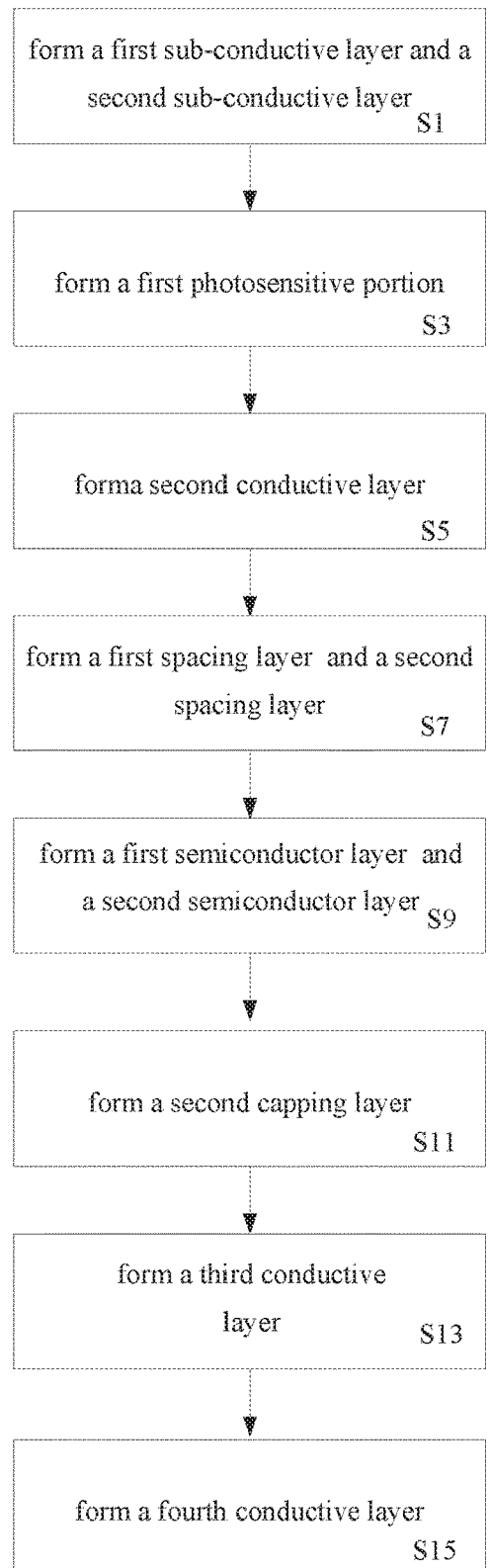
FIG. 6 is a flowchart of a method for fabricating a semiconductor device according to an embodiment of the present disclosure.
Figure 7:
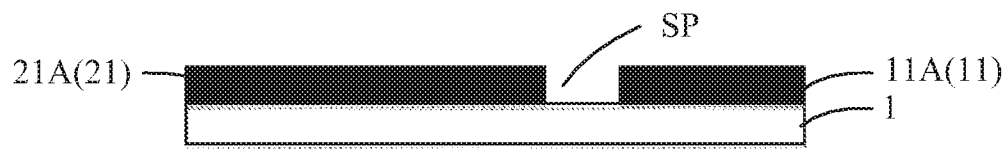
FIGS. 7($a$)-($h$) are process schematic diagrams of a method for fabricating a semiconductor device according to an embodiment of the present disclosure.
Figure 7:
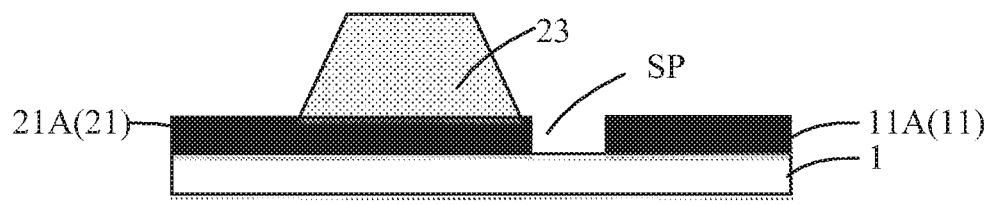
Figure 7:
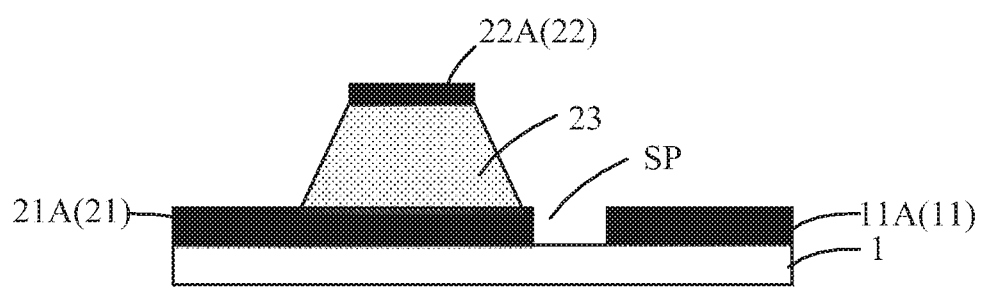
Figure 7:
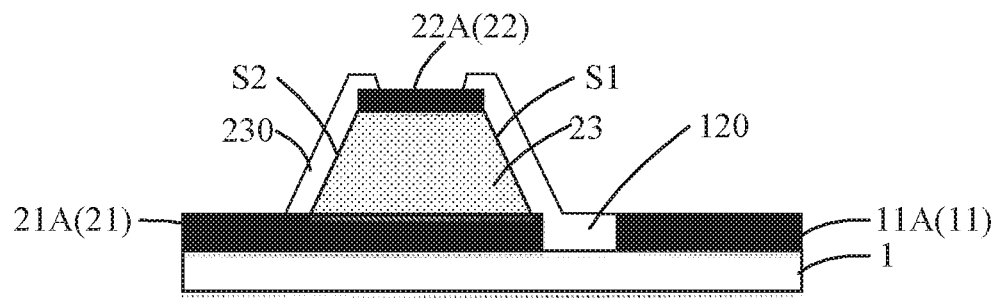
Figure 7:
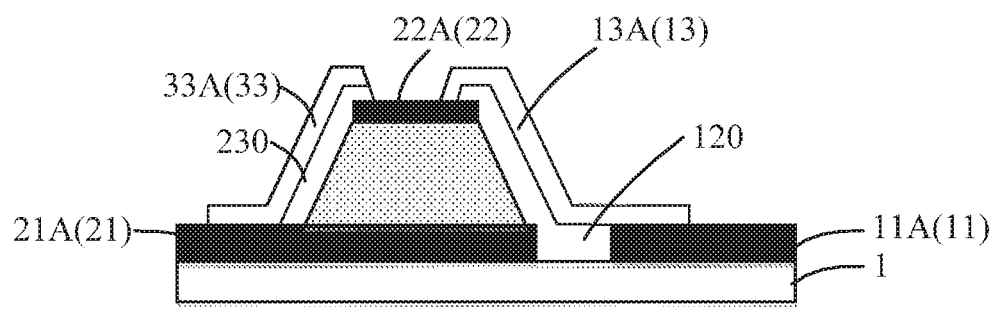
Figure 7:
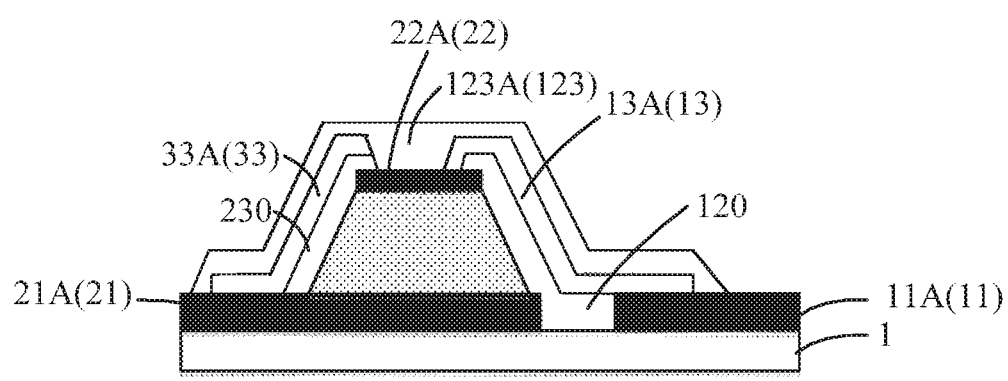
Figure 7:
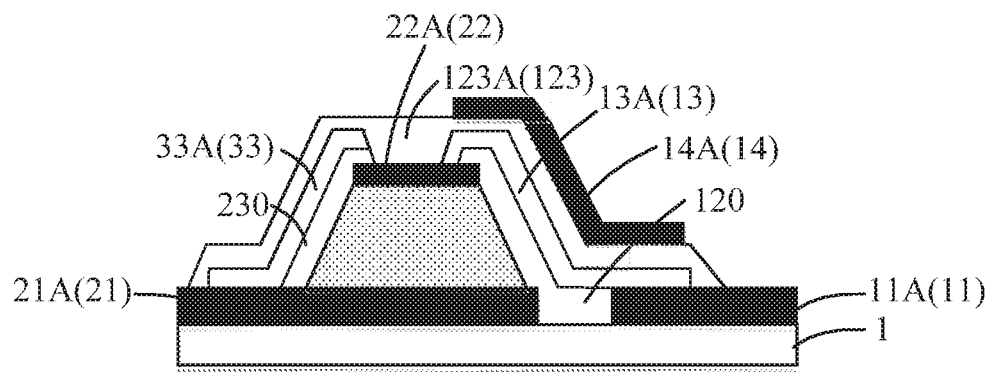
Figure 7:
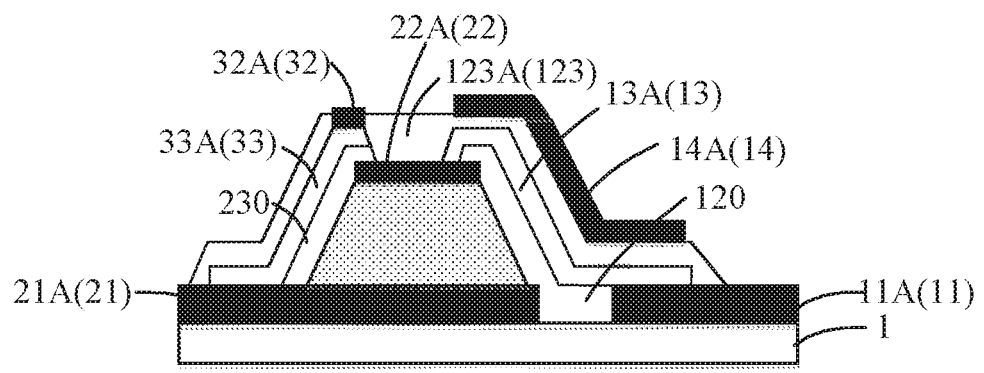

FIG. 6 is a flowchart of a method for fabricating a semiconductor device according to an embodiment of the present disclosure. FIG. 7(a)-FIG. 7(h) are process schematic diagrams of a method for fabricating a semiconductor device according to an embodiment of the present disclosure. A method for fabricating a semiconductor device according to an embodiment of the present disclosure will be described below with reference to FIGS. 6 and 7(a) to 7(h). As shown in FIGS. 6 and 7(a)-(h), forming the thin film transistor, the first light detection structure, and the second light detection structure includes:

S1. as shown in FIG. 7(a), forming, on a substrate 1, a first sub-conductive layer 11A as one 11 of a source electrode and a drain electrode of the thin film transistor and a second sub-conductive layer 21A as a first bottom electrode 21 of the first light detection structure, wherein, a space SP is arranged between the first sub-conductive layer 11A and the second sub-conductive layer;

S3, as shown in FIG. 7(b), forming a first photosensitive portion 23 on the second sub-conductive layer;

S5, as shown in FIG. 7(c), forming a second conductive layer 22A on the first photosensitive portion to form a first top electrode 22;

S7, as shown in FIG. 7(d), forming a first spacing layer 120 and a second spacing layer 230 on the first photosensitive portion 23, wherein the first spacing layer 120 covers the first side surface S1 of the first photosensitive portion 23 and a space SP, and the second spacing layer covers the second side surface S2 of the first photosensitive portion and a portion of the first top electrode 22;

S9, as shown in FIG. 7(e), forming a first semiconductor layer 13A and a second semiconductor layer 33A on the first spacing layer 120 and the second spacing layer 230, wherein the first semiconductor layer 13A overlies the first spacing layer 120 and is in contact with the first top electrode 22 to serve as an active layer 13 of the thin film transistor, and the second semiconductor layer 33A overlies the second spacing layer to serve as the second photosensitive portion 33 of the second light detection structure;

S11, as shown in FIG. 7(f), forming a second capping layer 123A, as an insulating layer 123, on the first semiconductor layer 13A and the second semiconductor layer 33A;

S13, as shown in FIG. 7(g), forming a third conductive layer 14A on the second capping layer 123A to form the gate electrode 14 of the thin film transistor;

S15. as shown in FIG. 7(h), forming a fourth conductive layer 32A on the second capping layer 123A, wherein the fourth conductive layer 32A is in contact with the second semiconductor layer 33A to serve as the second top electrode 32.

Figure 8:
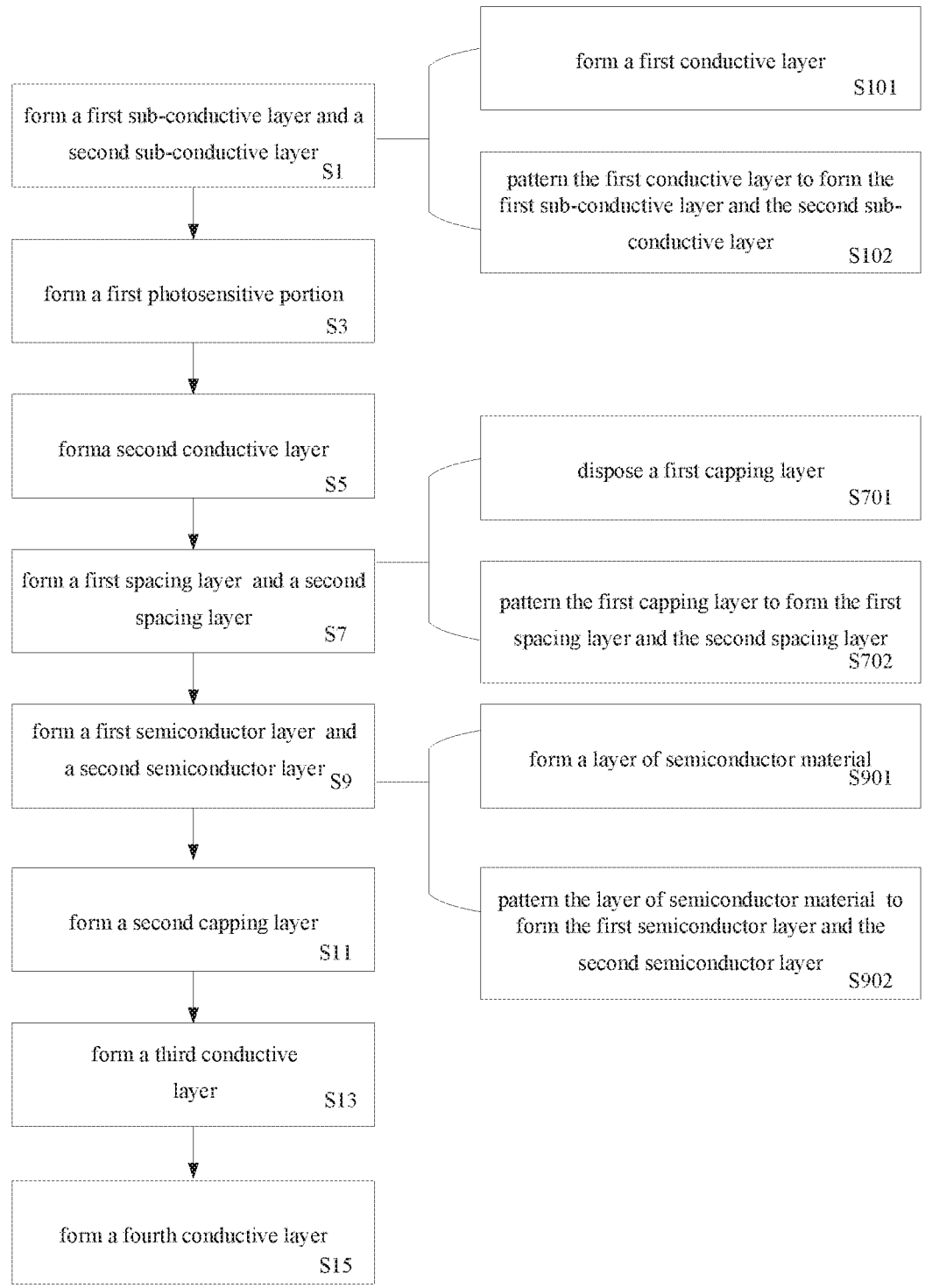
FIG. 8 is a further flow chart of the method for fabricating the semiconductor device of FIG. 6.

FIG. 8 is a further flow chart of the method for fabricating the semiconductor of FIG. 6. As shown in FIG. 8, forming the first sub-conductive layer and the second sub-conductive layer on the substrate includes:

S101: forming a first conductive layer on a substrate;

S102, patterning the first conductive layer to form the first sub-conductive layer and the second sub-conductive layer separated by the space.

Forming the first spacing layer and forming the second spacing layer includes:

S701: disposing a first capping layer on the space, the first side surface, a top surface of the first top electrode and the second side surface;

S702: patterning the first capping layer such that the patterned first capping layer comprises a first opening on the top surface of the first top electrode to form the first spacing layer and the second spacing layer spaced apart by the first opening, Forming the first semiconductor layer and the second semiconductor layer includes:

S901: forming a layer of semiconductor material on the first spacing layer and the second spacing layer;

S902: patterning the layer of semiconductor material such that the patterned layer of semiconductor material comprises a second opening on the top surface of the first top electrode to form the first semiconductor layer and the second semiconductor layer spaced apart by the second opening, and wherein the second opening and the first opening are aligned and the first semiconductor layer is in contact with the first top electrode.

The third conductive layer serving as the gate electrode of the thin film transistor may be formed by patterning and the fourth conductive layer functioning as the second top electrode may also be formed by patterning. The patterning process may include photolithography, wet etching, dry etching, etc., and will not be repeated here.

The first conductive layer and the third conductive layer may include a layer or layers including one or more of molybdenum (Mo), molybdenum niobium alloy (MoNb), aluminum (Al), aluminum neodymium alloy (AlNd), titanium (Ti) and copper (Cu). The first photosensitive portion may include, for example, a PIN structure for detecting visible light. The second photosensitive portion may include, for example, a UV light-sensitive material for detecting UV light. The second conductive layer and the fourth conductive layer may include a transparent conductive material such as ITO. The first capping layer and the second capping layer may include a layer or layers including one or more of silicon oxide (SiOx), silicon nitride (SiNx), hafnium oxide (HfOx), silicon oxynitride (SiON).

Considering the driving function of the thin film transistor and the light sensing function of the photo detector, the material of the active layer of the thin film transistor and the second photosensitive portion of the second light detection structure may include indium gallium zinc oxide (IGZO).

Figure 9:
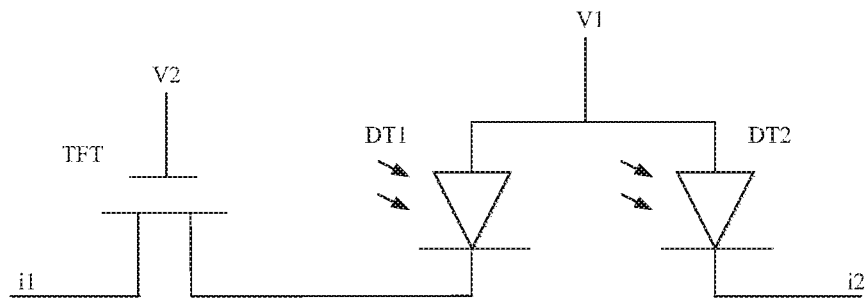
FIG. 9 is an equivalent circuit schematic of a semiconductor device according to an embodiment of the present disclosure.

FIG. 9 is an equivalent circuit schematic view of a semiconductor device according to an embodiment of the present disclosure. As shown in FIG. 9, a voltage V1 (for example, −3V) may be applied to the first light detecting structure DT1 and the second light detecting structure DT2, and apply a timing voltage V2 to the TFT. Thus, the fingerprint identification and the intensity detection of the external light source can be realized by detecting the current i1, and the intensity of the external ultraviolet ray can be detected by detecting the current i2.

Figure 10:
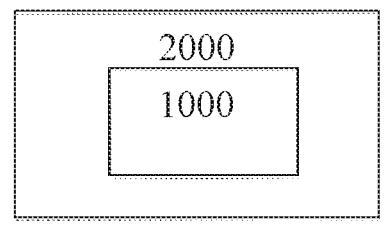
FIG. 10 is a schematic view of an array substrate according to an embodiment of the present disclosure.

FIG. 10 is a schematic view of an array substrate according to an embodiment of the present disclosure. As shown in FIG. 10, the array substrate 2000 according to the embodiment of the present disclosure includes the semiconductor device 1000 according to the present disclosure. The semiconductor device 1000 may include the semiconductor device as shown in FIGS. 1, 2, 3, 4, and 5.

Figure 11:
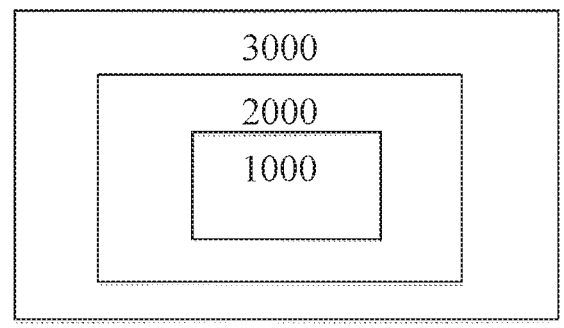
FIG. 11 is a schematic view of a display panel according to an embodiment of the present disclosure.

FIG. 11 is a schematic view of a display panel according to an embodiment of the present disclosure. As shown in FIG. 11, a display panel 3000 according to an embodiment of the present disclosure includes an array substrate 2000 according to the present disclosure. The array substrate may include the array substrate as shown in FIG. 10.

Figure 12:
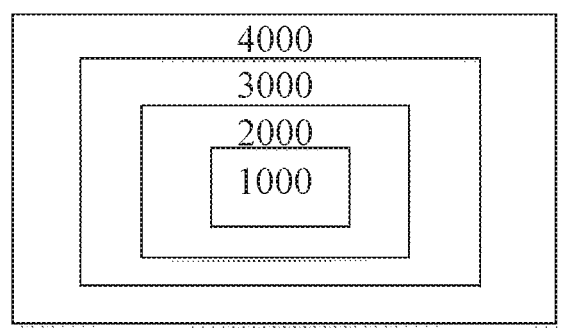
FIG. 12 is a schematic view of a display device according to an embodiment of the present disclosure.

FIG. 12 is a schematic view of a display device according to an embodiment of the present disclosure. As shown in FIG. 12, a display device 4000 according to an embodiment of the present disclosure includes a display panel 3000 according to the present disclosure. The display panel 3000 may include the display panel as shown in FIG. 11.

Having described certain specific embodiments, these embodiments have been presented by way of example only, and are not intended to limit the scope of the present disclosure. Indeed, the novel embodiments described herein may be embodied in various other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a substrate;
a thin film transistor positioned on the substrate; and
a first light detection structure adjacent to the thin film transistor, wherein:
the first light detection structure comprises a first bottom electrode, a first top electrode, and a first photosensitive portion disposed between the first bottom electrode and the first top electrode;
one of a source electrode and a drain electrode of the thin film transistor is disposed in the same layer as the first bottom electrode of the first light detection structure; and
the other of the source electrode and the drain electrode of the thin film transistor is the first top electrode.

2. The semiconductor device according to claim 1, wherein the first photosensitive portion has a bottom surface, a top surface, a first side surface facing the thin film transistor, and a second side surface facing away from the thin film transistor, and the semiconductor device further comprises:
a first spacing layer disposed between the thin film transistor and the first light detection structure, wherein the first spacing layer covers the first side surface and spaces the one of the source electrode and the drain electrode apart from the first bottom electrode.

3. The semiconductor device according to claim 2, further comprising a second light detection structure adjacent to the second side surface of the first light detection structure, wherein:
the second light detection structure comprises a second bottom electrode, a second top electrode, and a second photosensitive portion disposed between the second bottom electrode and the second top electrode;
the second bottom electrode and the first bottom electrode are integral; and
the second photosensitive portion extends on the second side surface.

4. The semiconductor device according to claim 3, further comprising:
a second spacing layer disposed between the first light detection structure and the second light detection structure, wherein the second spacing layer covers the second side surface and spaces the first top electrode apart from the second photosensitive portion.

5. The semiconductor device according to claim 4, further comprising an insulating layer, wherein the insulating layer has a first portion, a second portion, and a third portion, the first portion provided between an active layer and a gate electrode of the thin film transistor, the second portion overlying the first top electrode, and the third portion overlying the second photosensitive portion.

6. The semiconductor device according to claim 1, wherein the first photosensitive portion comprises a visible light sensitive material, and the first top electrode comprises a transparent conductive material.

7. The semiconductor device according to claim 1 wherein the first photosensitive portion comprises a PIN photosensitive structure.

8. The semiconductor device according to claim 3, wherein the second photosensitive portion comprises a UV light-sensitive material and the second top electrode comprises a transparent conductive material.

9. The semiconductor device according to claim 3, wherein the active layer of the thin film transistor and the second photosensitive portion of the second light detection structure comprise indium gallium zinc oxide.

10. An array substrate, comprising an array including the semiconductor device according to claim 1.

11. A display panel comprising a display including the array substrate according to claim 10.

12. A display device comprising a device including the display panel according to claim 11.

13. An array substrate, comprising an array including the semiconductor device according to claim 2.

14. An array substrate, comprising an array including the semiconductor device according to claim 3.

15. An array substrate, comprising an array including the semiconductor device according to claim 4.

16. A method of fabricating a semiconductor device, the method comprising:
forming a thin film transistor on a substrate and a first light detection structure adjacent to the thin film transistor, wherein:
the first light detection structure comprises a first bottom electrode, a top electrode and a first photosensitive portion disposed between the first bottom electrode and the first top electrode;

one of a source electrode and a drain electrode of the thin film transistor is disposed in the same layer as the first bottom electrode of the first light detection structure; and the other of the source electrode and the drain electrode of the thin film transistor is used as the first top electrode.

17. The method of fabricating a semiconductor device according to claim 16, wherein the first photosensitive portion has a bottom surface, a top surface, a first side surface facing the thin film transistor, and a second side surface facing away from the thin film transistor, the method further comprising:

forming a second light detection structure adjacent to a second side surface of the first light detection structure, wherein the second light detection structure comprises a second bottom electrode, a second top electrode, and a second photosensitive portion disposed between the second bottom electrode and the second top electrode, wherein:

the second bottom electrode and the first bottom electrode are integral; and the second photosensitive portion extends on the second side surface.

18. The method of fabricating a semiconductor device according to claim 17, wherein the thin film transistor and the second light detection structure are simultaneously formed.

19. The method of fabricating a semiconductor device according to claim 18, wherein forming the thin film transistor, the first light detection structure and the second light detection structure comprises:

forming, on the substrate, a first sub-conductive layer as one of a source electrode and a drain electrode of the thin film transistor and a second sub-conductive layer as a first bottom electrode of the first light detection structure, wherein a space is arranged between the first sub-conductive layer and the second sub-conductive layer;

forming the first photosensitive portion on the second sub-conductive layer;

forming a second conductive layer on the first photosensitive portion serving as the first top electrode;

forming a first spacing layer and a second spacing layer on the first photosensitive portion, wherein the first spacing layer covers a first side surface of the first photosensitive portion and the space, and the second spacing layer covers a second side surface of the first photosensitive portion and a portion of the first top electrode;

forming a first semiconductor layer and a second semiconductor layer on the first spacing layer and the second spacing layer, wherein the first semiconductor layer overlies the first spacing layer and is in contact with the first top electrode to serve as an active layer of the thin film transistor and the second semiconductor layer overlies the second spacing layer to serve as the second photosensitive portion of the second light detection structure;

forming a second capping layer on the first semiconductor layer and the second semiconductor layer;

forming a third conductive layer on the second capping layer to form a gate electrode of the thin film transistor; and forming a fourth conductive layer on the second capping layer, wherein the fourth conductive layer is in contact with the second semiconductor layer to serve as the second top electrode.

20. The method of fabricating a semiconductor device according to claim 19, wherein forming the first sub-conductive layer and the second sub-conductive layer on the substrate comprises:

forming a first conductive layer on the substrate; and patterning the first conductive layer to form the first sub-conductive layer and the second sub-conductive layer separated by the space;

wherein forming the first spacing layer and forming the second spacing layer comprises:

disposing a first capping layer on the space, the first side surface, a top surface of the first top electrode and the second side surface; and patterning the first capping layer such that the patterned first capping layer comprises a first opening on the top surface of the first top electrode to form the first spacing layer and the second spacing layer spaced apart by the first opening; and wherein forming the first semiconductor layer and the second semiconductor layer comprises:

forming a layer of semiconductor material on the first spacing layer and the second spacing layer; and patterning the layer of semiconductor material such that the patterned layer of semiconductor material comprises a second opening on the top surface of the first top electrode to form the first semiconductor layer and the second semiconductor layer spaced apart by the second opening; and wherein the second opening and the first opening are aligned and the first semiconductor layer is in contact with the first top electrode.

* * * * *